United States Patent [19]

Ikeda et al.

[11] Patent Number: 4,867,843
[45] Date of Patent: Sep. 19, 1989

[54] SURFACE ROUGHENING OF CERAMICS AND APPLICATION TO PRODUCTION OF CERAMIC WIRING BOARD

[75] Inventors: Masayoshi Ikeda, Katsuta; Yutaka Taniguchi, Ibaraki; Yukihisa Hiroyama, Katsuta, all of Japan

[73] Assignee: Hitachi Chemical Co., Tokyo, Japan

[21] Appl. No.: 250,158

[22] Filed: Sep. 28, 1988

[51] Int. Cl.$^4$ .......................... B44C 1/22; C23F 1/02; C03C 15/00; C03C 25/06
[52] U.S. Cl. ...................................... 156/651; 29/846; 156/654; 156/656; 156/659.1; 156/663; 156/667; 156/901; 252/79.2; 252/79.3; 252/79.5; 427/96; 427/98; 430/313; 430/318
[58] Field of Search ................. 156/651–654, 156/656–659.1, 663, 664, 667, 666, 901, 902; 29/846, 847; 427/96, 98, 305, 309; 430/313, 318, 323; 204/38.4; 428/209, 901; 174/68.5; 252/79.2, 79.3, 79.5

[56] References Cited

U.S. PATENT DOCUMENTS

| | | | |
|---|---|---|---|
| 4,647,477 | 3/1987 | DeLuca | 427/98 |
| 4,683,168 | 7/1987 | Hares | 427/309 X |
| 4,721,549 | 1/1988 | Bogenschutz et al. | 156/663 |

Primary Examiner—William A. Powell
Attorney, Agent, or Firm—Antonelli, Terry & Wands

[57] ABSTRACT

A surface of ceramic plate is roughened uniformly by immersing in a mixed solution comprising $NH_4F$, $(NH_4)_2SO_4$, $H_2SO_4$ and $H_2O$, followed by immersion in molten NaOH, and the resulting surface roughened ceramic plate can be used for producing a ceramic wiring board.

7 Claims, No Drawings

SURFACE ROUGHENING OF CERAMICS AND APPLICATION TO PRODUCTION OF CERAMIC WIRING BOARD

BACKGROUND OF THE INVENTION

This invention relates to a process for roughening a surface of a ceramic and a process for producing a printed wiring board using the resulting surface roughened ceramic.

As surface roughening methods of ceramics, there have been known a process for treating a surface of ceramic with HF, $HBF_4$, or the like for roughening and a process for treating a surface of ceramic with a molten alkali such as NaOH, KOH or the like.

On the other hand, a ceramic wiring board is produced by roughening a surface of a ceramic, subjecting to electroless plating, and if necessary electrical plating, to deposit a metal coating directly on the ceramic, and subjecting to etching or the like to form a conductor wiring. In this process, when the former surface roughening process is employed, adhesive strength between the metal coating and the ceramic becomes weak and there arises a defect in that the metal coating is to have blisters. On the other hand, when the latter surface roughening process is employed, good adhesive strength between the metal coating and the ceramic is not always obtained (i.e. sometimes the good adhesive strength is obtained, but sometimes no good adhesive strength is obtained, and the deviation is large), and blisters are generated in the metal coating when the thickness of electroless copper plated film is over 1 $\mu$m, which results in making practical use impossible.

SUMMARY OF THE INVENTION

It is an object of this invention to provide a surface roughening process of ceramics and a process for producing a ceramic wiring board using the resulting surface roughened ceramics overcoming the defects of the prior art.

This invention provides a process for roughening a surface of a ceramic which comprises, immersing a ceramic in a mixed solution comprising $NH_4F$, $(NH_4)_2SO_4$, $H_2SO_4$ and $H_2O$,
washing the resulting ceramic with water, and
immersing said ceramic in molten NaOH.

This invention also provide a process for using the thus obtained surface roughened ceramic in the production of a ceramic wiring board.

DESCRIPTION OF THE PREFERRED EMBODIMENTS

The present inventors have found that according to the prior art techniques only flux (vitreous material) and a part of major component particles (e.g. alumina particles in the case of alumina ceramics) on a ceramic surface is roughened and the roughening of major component particles is insufficient.

Therefore, in the present invention, a mixed solution comprising $NH_4F$, $(NH_4)_2SO_4$, $H_2SO_4$ and $H_2O$ is used for immersing a ceramic, followed by washing with water and immersion in molten NaOH so as to rough the ceramic surface uniformly.

The composition of the mixed solution changes depending on the composition of ceramic to be roughened. The mixed solution preferably comprises 30 to 60% by weight of $NH_4F$, 1 to 10% by weight of $(NH_4)_2SO_4$, 5 to 20% by weight of $H_2SO_4$ and 10 to 64% by weight of $H_0{_{115}}{_2}O$. If necessary, the mixed solution can contain HF, $HBF_4$, HCl, NaCl, and the like.

Immersing time of the ceramic in the mixed solution is preferably 1 minute or more when the temperature of the mixed solution is 30° to 90° C.

The molten NaOH can be obtained by heating NaOH at a temperature higher than the melting point of NaOH. There is no upper limit of the heating temperature, but about 600° C. or lower is preferable considering the production cost and workability.

The immersion time of the surface roughed ceramic in the molten NaOH is preferably 30 seconds or more.

If necessary, immersion in the molten NaOH can be carried out 2 times or more.

As a neutralizing solution for the molten NaOH, there can be used $H_2SO_4$, $H_3PO_4$, HCl, or the like.

As the ceramic, there can be used alumina ceramics, ceramics of zirconia, mullite, beryllia, steatite, silicon carbide, aluminum nitride, etc.

As mentioned above, in the first stage, the flux and only a part of major component particles are etched chemically by hydrofluoric acid generated from the mixed solution comprising $NH_4F$, $(NH_4)_2SO_4$, $H_2SO_4$ and $H_2O$ to form a roughed ceramic surface. After washing with water, the resulting ceramic is subjected to the second stage roughening wherein fine etching of the major component particles of the ceramic particles is conducted by the molten NaOH to form uniformly roughened ceramic surface.

Then, the resulting ceramic is neutralized, washed with water and subjected to electroless plating to form a metal coating on the roughened ceramic surface according to a conventional process. Then, a resist film is formed on the resulting metal coating and subjected to conventional exposure to light, development, etching, removal of the resist film so as to form a conductor wiring pattern by retaining only necessary portions of the metal coating. Thus, a ceramic wiring board having no prior art defects mentioned above can be produced.

This invention is illustrated by way of the following Examples in which all percents are by weight unless otherwise specified.

EXAMPLE 1

An alumina ceramic substrate (Hallox 552, a trade name, mfd. by Hitachi Chemical Company, Ltd., 80 mm long, 80 mm wide and 0.8 mm thick) was cleaned with a degreasing solution (HCR 201, a trade name, mfd. by Hitachi Chemical Company, Ltd.), dried and immersed in a mixed solution containing 10 g (40.5%) of $NH_4F$, 1 g (4.1%) of $(NH_4)_2SO_4$, 2 ml (14.9%) of concentrated $H_2SO_4$ and 10 ml (40.5%) of $H_2O$ (liquid temperature 70° C.) for 10 minutes to carry out surface roughening. Then, the resulting ceramic substrate was washed with water, dried and immersed in molten NaOH heated at 350° C. for 1 minute to carry out roughening again. Then, the resulting ceramic substrate was immersed in a 10% $H_2SO_4$ solution for 5 minutes while provided with vibration energy by supersonic waves (power 300 W) so as to neutralize the ceramic surface. After washing with water, the ceramic substrate was subjected to electroless copper plating for 3 hours to form a copper coating film of 7 $\mu$m thick. The electroless copper plating bath had a composition as shown in Table 1 and a pH of 12.4.

TABLE 1

| Composition | Proportion |
| --- | --- |
| $CuSO_4.5H_2O$ | 8 g/l |
| Sodium ethylenediamine-tetraacetate | 60 g/l |
| Formalin (special reagent grade) | 3 ml/l |

After plating, a photosensitive resist film (PHT-862 AF-40, a trade name, mfd. by Hitachi Chemical Company, Ltd.) was adhered to a whole surface of the resulting copper coating, and a negative film having the same transparent portions as the conductor wiring to be obtained was laminated thereon. After exposing to light, the photosensitive resist film under the transparent portions of the negative film was cured. The negative film was removed and uncured portions (non-exposed portions) of the photosensitive resist film were removed by development, followed by etching with a 25% ammonium persulfate solution to remove unnecessary portions as a conductor wiring of the copper coating. Then, the cured photosensitive resist film was peeled with a 5% NaOH solution to give a ceramic wiring board forming a conductor wiring (a pattern of 2×2 mm) thereon.

Using 30 ceramic wiring boards thus produced, sticking (adhesive) strength was measured by soldering a copper wire having a diameter of 0.6 mm on a pattern of 2 mm wide and 2 mm long, stretching the copper wire at a tensile rate of 20 mm/min, and measuring the strength at which the copper wire was removed from the pattern.

The adhesive strength was as good as 2.5 to 4.0 kg/mm$^2$. Further, there was no blisters in the copper coating and good surface appearance was obtained.

COMPARATIVE EXAMPLE 1

The same alumina ceramic substrate as used in Example 1 was washed with the same degreasing solution as used in Example 1, dried and immersed in a 10% HF solution at 40° C. for 20 minutes to carry out roughening. Then, the neutralization was carried out by immersing in a 10% NaOH solution for 5 minutes. After washing with water, the electroless copper plating and conductor wiring formation were carried out in the same manner as described in Example 1.

The adhesive strength was 0.5 kg/mm2 or less, and several of them were not able to be measured. Further, blisters were generated on the whole copper coating.

COMPARATIVE EXAMPLE 2

The same alumina ceramic substrate as used in Example 1 was washed with the same degreasing solution as used in Example 1, dried and immersed in molten NaOH heated at 500° C. for 5 minutes to carry out roughening. Then, the neutralization was carried out by immersing in a 10% $H_2SO_4$ solution for 5 minutes. After washing with water, the electroless copper plating and conductor wiring formation were carried out in the same manner as described in Example 1.

The adhesive strength was 3.5 kg/mm$^2$ at maximum, but 0 kg/mm$^2$ at minimum, with a large number of deviations. Further, blisters were generated on some portions of the copper coating.

According to the present invention, the ceramic surface can be roughened uniformly. Further, even if a conductor wiring is formed on the surface of ceramic, the adhesive strength of conductor wiring, that is, the metal coating and the ceramic, is good without causing blisters in the copper coating.

What is claimed is:

1. A process for roughening a surface of a ceramic which comprises
    immersing a ceramic in a mixed solution comprising $NH_4F$, $(NH_4)_2SO_4$, $H_2SO_4$ and $H_2O$,
    washing the resulting ceramic with water, and
    immersing said ceramic in molten NaOH.
2. A process according to claim 1, wherein the mixed solution comprises 30 to 60% by weight of $NH_4F$, 1 to 10% by weight of $(NH_4)_2SO_4$, 5 to 20% by weight of $H_2SO_4$ and 10 to 64% by weight of $H_2O$.
3. A process according to claim 1, wherein the mixed solution is heated at a temperature of 30° C. to 90° C.
4. A process according to claim 1, wherein the ceramic is alumina ceramic.
5. A process for using a surface roughened ceramic obtained in claim 1 in the production of a ceramic wiring board.
6. A process for producing a ceramic wiring board which comprises
    immersing a ceramic in a mixed solution comprising $NH_4F$, $(NH_4)_2SO_4$, $H_2SO_4$ and $H_2O$,
    washing the resulting ceramic with water,
    immersing said ceramic in molten NaOH to roughen a surface of the ceramic,
    forming a metal coating on the surface roughened ceramic by an electroless plating method,
    forming a resist layer on the metal coating, and
    forming a conductor pattern by exposure to light, development, etching and removal of unnecessary portions.
7. A process according to claim 6, wherein the mixed solution comprises 30 to 60% by weight of $NH_4F$, 1 to 10% by weight of $(NH_4)_2SO_4$, 5 to 20% by weight of $H_2SO_4$ and 10 to 64% by weight of $H_2O$.

* * * * *